United States Patent [19]

Bean et al.

[11] 3,936,929

[45] Feb. 10, 1976

[54] FET AND BIPOLAR DEVICE AND CIRCUIT PROCESS WITH MAXIMUM JUNCTION CONTROL

[75] Inventors: Kenneth E. Bean; William W. Lloyd, both of Richardson, Tex.

[73] Assignee: Texas Instruments Incorporated, Dallas, Tex.

[22] Filed: June 26, 1974

[21] Appl. No.: 483,264

Related U.S. Application Data

[62] Division of Ser. No. 275,116, July 26, 1972.

[52] U.S. Cl. .................... 29/580; 148/175; 357/49; 29/577
[51] Int. Cl.² .......................................... B01J 17/00
[58] Field of Search ............... 29/580, 576 IW, 577; 357/49; 148/175

[56] References Cited
UNITED STATES PATENTS 3,404,450  10/1968  Karcher .............................. 29/577
3,696,274  10/1972  Davis ................................ 357/49
3,786,560   1/1974  Cunningham ...................... 29/580

*Primary Examiner*—W. Tupman
*Attorney, Agent, or Firm*—Harold Levine; James T. Comfort; Gary C. Honeycutt

[57] ABSTRACT

Disclosed are improved field-effect and bipolar semiconductor devices and the method of making them, wherein maximum junction control provides highly predictable device parameters. Low temperature epitaxial depositions provide tight junction thickness and resistivity control, and an orientation dependent etch forms grooves circumscribing portions of the host substrate and overlying epitaxial layers to provide dielectrically isolated single crystalline mesas utilized in forming electronic devices.

8 Claims, 12 Drawing Figures

FET AND BIPOLAR DEVICE AND CIRCUIT PROCESS WITH MAXIMUM JUNCTION CONTROL

This is a division of application Ser. No. 275,116, filed July 26, 1972.

The invention relates to semiconductor devices and methods of making them, and, more particularly, to dielectrically isolated semiconductor electronic devices of the mesa type utilizing a plurality of epitaxially grown layers and an orientation dependent etch to form the mesas.

BACKGROUND OF THE INVENTION

As semiconductor devices and integrated circuits become more sophisticated and are required to provide more complex functions, precise junction control becomes a critical process requirement. That is, tight resistivity control and exact thickness with sharp non-graded junction control of the various regions comprising the semiconductor device become more crucial as the complexity increases. Generally, the more complex the function which the device is to provide, the more exact the process parameters must be, with smaller tolerances allowed for an operative device. To make such precisely characterized devices reproducible in large scale production, a manufacturing process is required which minimizes the process variables.

Techniques heretofore utilized in providing semiconductor electronic devices requiring exact process control have utilized conventional techniques, such as diffusion into an epitaxially grown layer, only with more stringent requirements on the diffusion process steps. That is, more precise control was required of the time, temperatures, surface concentrations of the dopant, and purity of the environment. Such techniques, however, do not lend themselves to large volume production and yet retain the exact process parameters required. Other processes developed include the "single support layer" technique over which this invention is an improvement, as described by U.S. Pat. No. 3,290,753, issued Dec. 13, 1966. Another process is the "double support layer" technique described in *Electronic Industries*, Vol. 24, No. 6, pp 38–42 (June 1965).

In bipolar semiconductor technology devices having precise resistivity control and thickness control are desired to minimize junction breakdown and leakage characteristics and for exact predictability of the completed device. For example, a bipolar transistor having precisely controlled, epitaxially grown, collector and base regions realizes the advantages of an abrupt junction unachievable by diffusion techniques. However, such a process has heretofore suffered from the inability to affectively contact the epitaxially grown regions and still contact an emitter region formed in the base region. Other bipolar devices, such as SCR's, lateral transistors, and triacs obtain the advantage of such precise process control, heretofore related.

Field effect semiconductor devices also require exact resistivity and thickness control of the layers comprising the device, as the device becomes more sophisticated. That is, very tight channel thickness control and resistivity control allow more exact predictability of the characterization of the completed device when formed in a high volume production process.

Accordingly, it is an object of the present invention to provide devices and methods of producing them which provide tight junction control and resistivity control. It is another object of the present invention to provide semiconductor devices having tight process parametric control utilizing one or multiple epitaxially grown regions which are dielectrically isolated. It is still another object of the present invention to provide improved bipolar and field effect transistors both as discrete devices and in integrated circuits by a process rendering tight process parameters for improved performance and for improved reproducibility.

BRIEF DESCRIPTION OF THE INVENTION

Briefly, and in accordance with one embodiment of the invention, a single or a plurality of monocrystalline semiconductor layers are expitaxially grown overlying a semiconductor substrate or other suitable support means. The epitaxial growth is precisely controlled to provide exact resistivity and thickness control of each respective layer. Thereafter, an orientation dependent etch provides grooves circumscribing the epitaxially grown layers to provide dielectrically isolated single crystal mesas. The isolation grooves penetrate to either a P/N junction or a dielectric film which electrically isolates the mesas from the support means. Semiconductor electronic devices comprising these layers are thereafter formed in the mesas. Regions are selectively formed in the upper epitaxial layers contacting lower layers to provide reliable electrical contact thereto.

Bipolar transistors are formed utilizing the epitaxially grown layers as collectors, bases, and emitters and field-effect devices are formed utilizing an epitaxially grown layer as the channel region. A suitable dielectric material deposited within the isolation grooves or providing the isolation groves having shallow sloped sidewalls allows electrical interconnects to be formed thereover in integrated circuit configuration.

Novel features believed to be characteristic of this invention are set forth in the appended claims. The invention itself, however, as well as other objects and advantages thereof, may best be understood by reference to the following detailed description of preferred embodiments of the invention, wherein:

DETAILED DESCRIPTION OF THE DRAWINGS

Figure 1A:
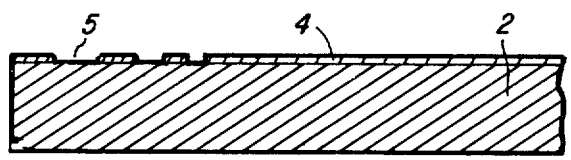
FIGS. 1A–1G depict various stages in the process of providing a basic structure from which a plurality of final embodiments are formed.
Figure 1B:
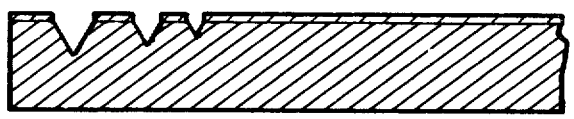
Figure 1C:
Figure 1D:
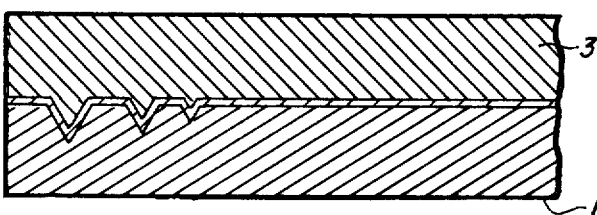
Figure 1E:
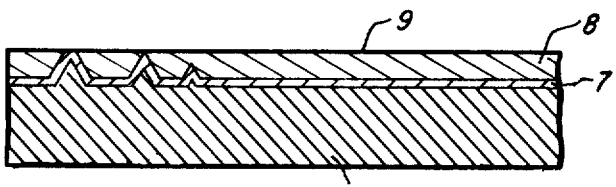
Figure 1F:
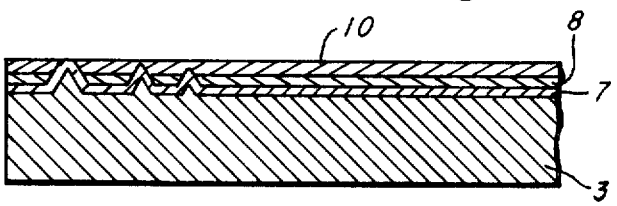

For purposes of illustrational simplicity and clarity, the figures contained herein are not geometrically proportioned. The dimensions given in the following detailed description of each figure are to be construed as exemplary dimensions and are not to be construed as in disagreement with the drawings. Furthermore, as a plurality of embodiments have been illustrated, those embodiments having common elements with other embodiments have similar part numbers of clarity and simplification of description.

Referring now to the drawings, FIGS. 1A–1G depict process steps of the method of this invention in providing an intermediate structure utilized in forming the plurality of structural embodiments of this invention.

FIGS. 1A–1E illustrate an optional sequence which is utilized in providing a means for controlling the thickness of a thin layer of semiconductor material. In the preferred embodiment of the invention, steps 1A–1E are advantageously utilized to provide a high monocrystalline silicon region 8 from a monocrystalline silicon substrate 2. In this embodiment, the silicon structure 2 is preferably oriented in a (100) crystal orientation and is highly doped P-type but is of opposite type for other embodiments herein later described. The doping concentration is a design choice, as will be apparent in the particular finalized device structure. Typically, substrate 2 has a resistivity of 0.006 ohm-cm and is provided utilizing well-known techniques in the art such as doping with boron to a concentration of $2 \times 10^{19}$ atoms/cm$^3$.

Formed overlying the surface of substrate 2 is an orientation-dependent-etch-resistant masking layer 4 comprising silicon dioxide. Oxide mask 4 typically is 10,000 angstroms thick and has formed therein apertures 5 exposing the substrate 2. Grooves 6 of desired depths related directly to oxide mask opening width are formed in the substrate 2, using an orientation dependent etch (O.D.E.). As is well known in the art of O.D.E., a 50% potassium hydroxide/water mixture is a suitable etchant for silicon. After forming the O.D.E. grooves 6, a thin, separation oxide layer 7 is grown, utilizing well-known techniques, to an approximate depth of 12,000 A. Thereafter, a polycrystalline silicon layer 3 of any suitable type and conductivity is deposited overlying the oxide 7 to provide mechanical support. The silicon substrate 2 is then lapped, etched, or otherwise removed from the surface 1 to the desired depth indicator to form thin layer 8. A typical thickness for layer 8 is 1.0 mil.

The above described process is described in detail in copending patent application IMPROVEMENT IN METHODS FOR FORMING CIRCUIT COMPONENTS WITHIN A SUBSTRATE AND SEMICONDUCTOR SUBSTRATE, Ser. No. 788,177, filed Dec. 31, 1968 by Kenneth E. Bean.

After having provided single crystalline highly doped P-type layer 8 of the desired thickness, for example 1.0 mils with such thickness determined by the characteristic desired for the particular type of electronic device, a vapor phase etch is utilized to remove all impurities and damaged regions from the upper surface 9 of the P-type layer 8. Vapor phase etching is well-known in the art and is preferably utilized as the lapping step which forms P-type layer 8 usually damages the surface of the layer. The vapor phase etch provides a near ideal surface on which to nucleate growth of the epitaxial layer.

The vapor etch typically removes approximately 0.5 mils from the surface 9 of the layer 8. As the thickness of layer 8 initially is preferably 1.0 mils, the final layer thickness is approximately 0.5 mils.

Monocrystalline layer 10 is thereafter grown overlying P-type layer 8. In the preferred embodiment, layer 10 is N-type and is typically formed by the low temperature decomposition of silane. As is well-known in the art, such a process proceeds at approximately 1000°C. which minimizes the up-diffusion of the heavily doped P-type layer 8 into the lesser doped layer 10 to retain sharp junction definition. The resistivity and thickness of the layer 10 is a design choice with typical values being 0.6 ohm/cm and a thickness of 0.2 mils. A phosphorus dopant may be utilized to provide a doping concentration of $10^{16}$ atoms/cm$^3$.

Although not shown in FIGS. 1A–1G, additional epitaxially grown single crystalline layers may advantageously be grown overlying epi-layer 10. As will be apparent later in this application, such additional layers are utilized to provide various types of electronic devices, especially in bipolar technologies.

After having provided the desired number of epitaxially grown layers, a mask material, for example low temperature silicon dioxide, is deposited or grown, and apertures opened using standard photolithographic processes. Thereafter isolation grooves 12 are formed through the epitaxially grown layers to the separation oxide 7. A preferred mode of forming grooves 12 is by orientation dependent etching layers 8 and 10 after having properly masked with layer 13 the surface of the epitaxially grown layers. As is well-known in the art, grooves 12 are predictably formed in (100) crystal orientation material, which have well-known structures. That is, mesas 14 which are formed by the circumscribing aperture 12 have sloped sidewalls at an angle of 46° or 54° with the surface of the oxide layer 7. Such a slope is advantageously utilized in forming grooves 12 of a desired width and depth to allow dependable electrical interconnection of the mesas by metallic interconnects. Depositing metal over sharp corners while maintaining reliable continuity has plagued the art for many years. This invention allows metallic interconnect formation over less than sharp angles to allow reliable electrical connection to the mesas. For a more detailed description of orientation dependent etching isolation grooves in (110) and (100) crystal oriented silicon material, reference is made to copending patent application HIGH PACKING DENSITY ISOLATION PROCESS, Ser. No. 171,662, filed Aug. 13, 1971 by Kenneth E. Bean et al.

The above described process is equally suitable for providing a structure having P/N junction isolation instead of a dielectric isolation underlying the monocrystalline mesa. In such a case region 7 of FIG. 1G comprises semiconductor of type opposite that of layer 8.

Figure 1G:
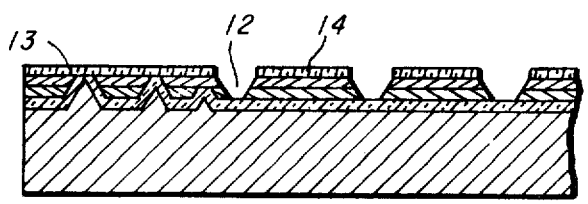
Figure 2A:
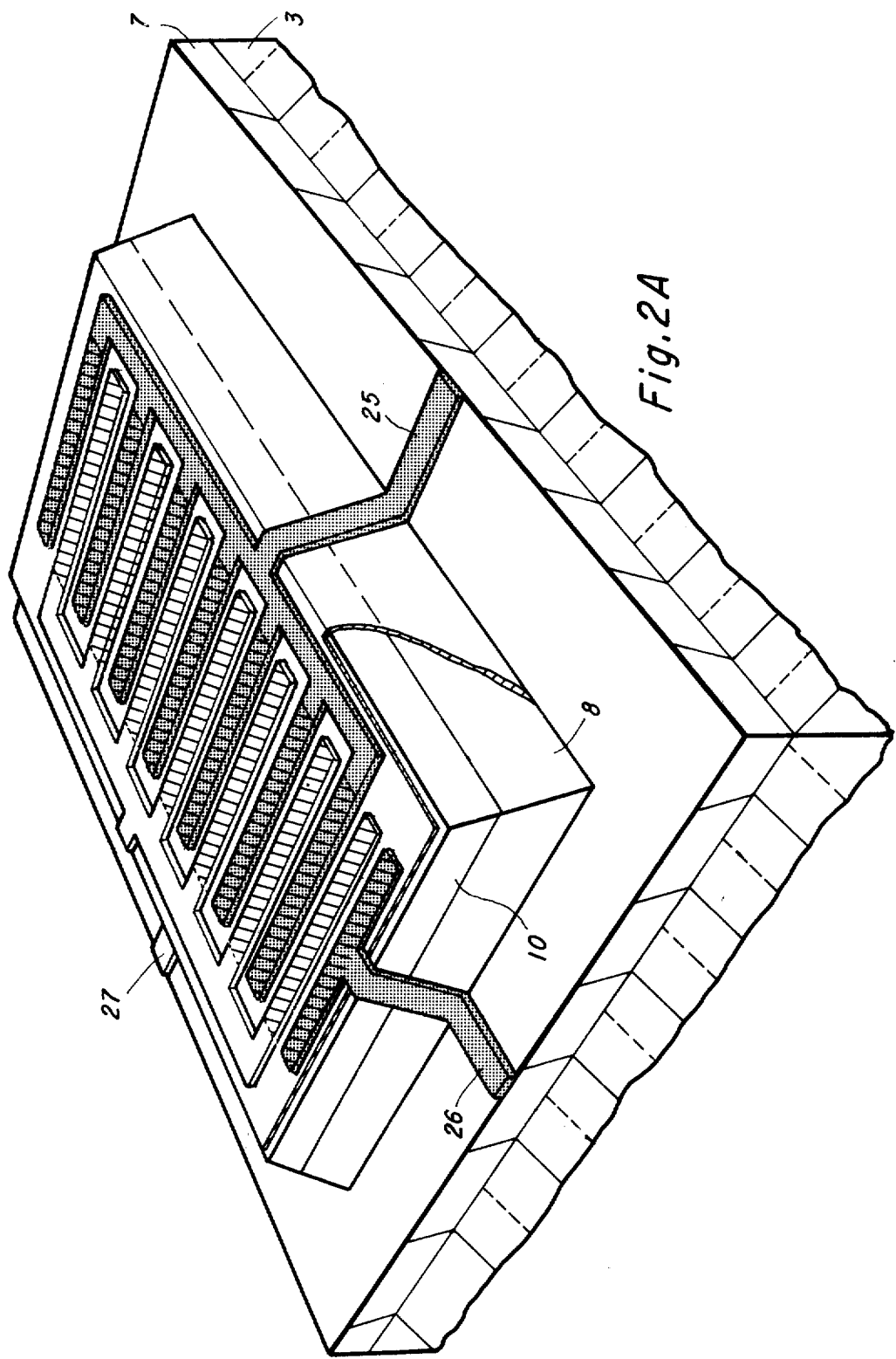
FIGS. 2A and 2B depict a JFET formed from the structure of FIG. 1G.
Figure 2B:
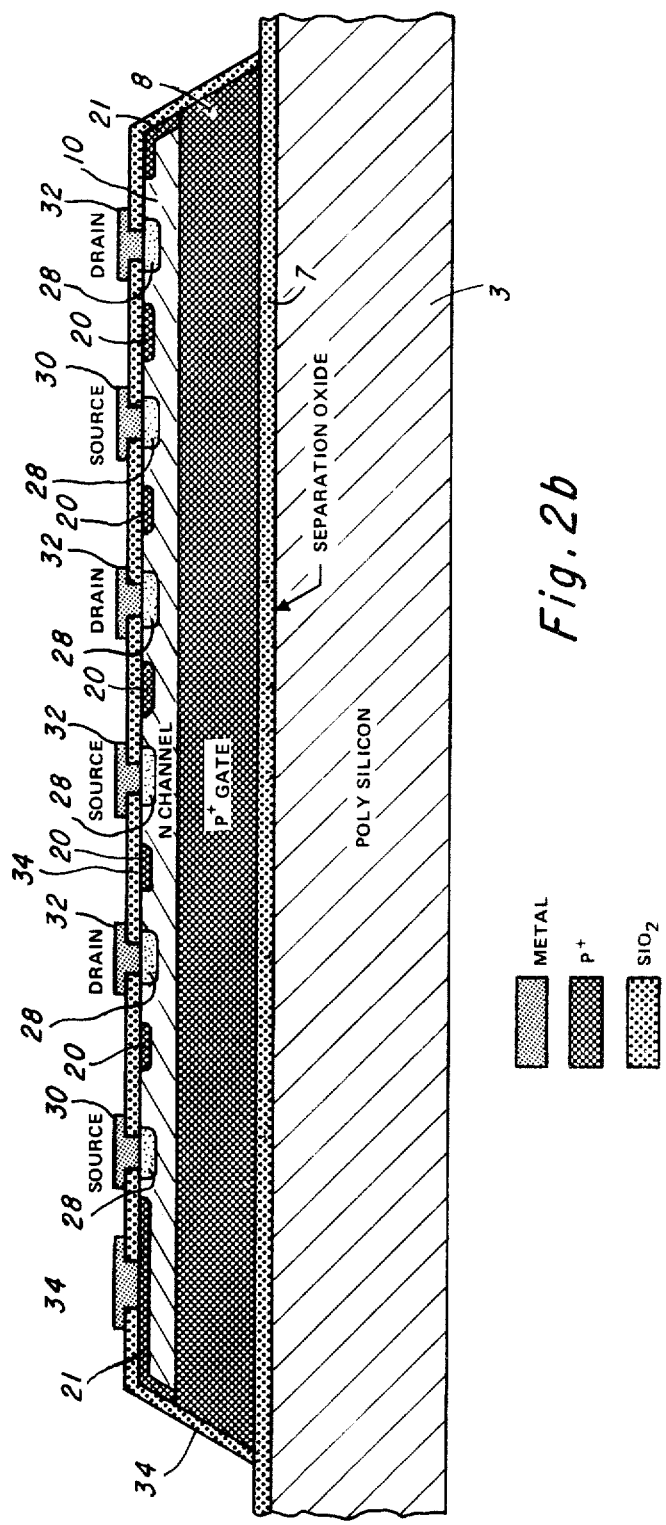

Referring now to FIGS. 2A and 2B, there is depicted a preferred embodiment of the invention, wherein a junction field-effect transistor (hereafter referred to as JFET) has been formed from the structure shown in FIG. 1G. After having removed the O.D.E. masking layer 13 to expose the upper surface of the mesa 14, a plurality of highly doped P-regions 20 are selectively formed in the upper layer 10 by, for example, diffusing boron selectively. Conventional photolithographic/masking techniques are suitable and a typical concentration of P-type regions 20 is $2 \times 10^{19}$ atoms/cm$^3$. As above noted, the channel layer 10 is typically 0.2 mils thick, and P+ type regions 20 extend approximately 0.06 mils into the channel layer 10, depending on design choice.

While forming P-type regions 20, P-type regions 21 are simultaneously formed in channel layer 10, extending to the P+ layer 8. Highly doped regions 21 provide electrical contact to layer 10 which functions as the gate in the FET. Shown in FIG. 2A underlying the metal contact 25-27 are N+ regions 28 which provide for connecting source and drain terminals 30 and 32 respectively of FIG. 2B to the N-channel layer 10. Such a region 28 is provided, as is well-known in the art, to enhance the electrical contact and is typically doped using phosphorous to a concentration of $5 \times 10^{20}$ atoms per cc.

After forming all the diffused regions 20, 28 and 21, silicon dioxide layer 34 is formed in FIG. 2B overlying the upper surface of the mesa as in FIG. 1G, utilizing low temperature techniques. Apertures are selectively formed therein overlying regions 21, 28 and 20 through which metallic contacts provide respectively gate, source, and drain contacts. A typical thickness for oxide layer 34 is 5,000 angstroms.

Dimensions of the source, drain, and gate are, of course, design choices. However, typically the source and drain regions 28 and the upper-gate region 20 are 0.2 mils wide and 0.06 mils deep. A typical separation between source, upper gate, and drain regions is 0.3 mils between each.

Dimensions and resistivities heretofore expressed provide a final JFET, as shown in FIG. 2A, wherein a relatively high drain-to-source breakdown voltage of 30 volts is achieved. By utilizing the dielectric isolation process herein described, epitaxial layer 10 is exposed to minimal high heat treatment after its formation. That is, successive epitaxially grown layers are formed by low temperature processes as earlier described, and the O.D.E. isolation groove process eliminates the high temperature isolation diffusion which tends to also diffuse the epitaxial layers. Accordingly, as epitaxially grown layers are grown to very controllable specifications and dimensions, devices such as the JFET above described, are formed which have very tight channel tolerances. Such tight channel control allows finalized structures providing a widerange of desired and predictable electrical characteristics.

Conventional techniques utilizing a high temperature oxide formation step, such as growing oxide in the isolation grooves to provide other than an air dielectric, are deleterious to the sharp junction definition of the epitaxially grown layers. By utilizing air dielectric, such an effect is avoided. The advantages of utilizing an air dielectric are further enhanced upon considering the metallic interconnects are reliably formed over the corners of the low angled grooves without danger of electrical failure.

OTHER EMBODIMENTS OF THE INVENTION

Figure 3:
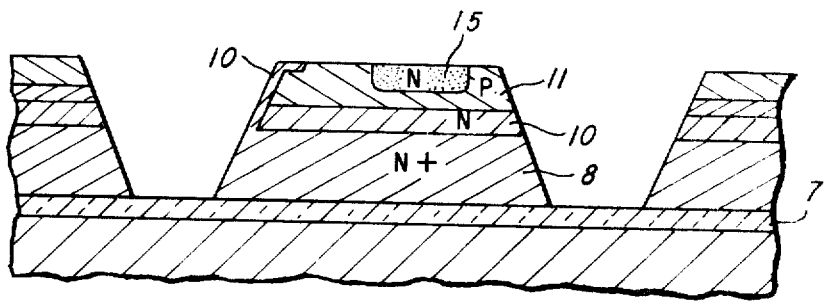
FIG. 3 depicts a bipolar transistor formed from the structure of FIG. 1G.

The method of the invention heretofore described is equally suitable to the formation of other dielectrically isolated semiconductor devices, such as bipolar transistors. FIG. 3 illustrates such a dielectrically isolated bipolar transistor formed from the intermediate structure of FIG. 1G, wherein substrate layer 8 is a highly doped N type. A typical resistivity for layer 8 is 0.009 ohm centimeters which is provided utilizing the well-known Czochvalski techniques of crystal growth, doped with phosphorous to provide a concentration of approximately $6 \times 10^{18}$ atoms per cc. Following the technique earlier described, after the vapor etch damage removal step, an epitaxial layer 10 is thereover grown. A typical resistivity and thickness is $0.22 \pm 0.02$ ohm cm. to a thickness of $7.5 \pm 0.5$ microns. A second epitaxially grown layer 11 is thereafter formed overlying layer 10 using a similar low temperature silane process for example. Layer 11 is P-type and is, for example, moderately doped to a concentration of approximately $3.5 \times 10^{18}$ atoms per cc. which provides a resistivity of approximately 0.026 ohm cm. Layers 10 and 11 respectively provide the collector and base of the transistor to be formed. An N-type emitter region 15 is formed in layer 11, utilizing well-known techniques such as the diffusion of phosphorous to a concentration of $1 \times 10^{21}$ atoms per cc. Simultaneous with the formation of region 15 is the formation of region 10' which electrically connects to collector region 10. Conventional metallization techniques allow electrical connection to regions 10', 11 and 15 to provide the collector, base and emitter respectively.

Figure 4:
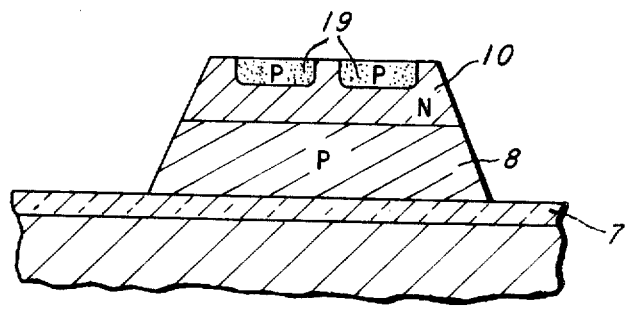
FIG. 4 depicts a lateral bipolar transistor formed according to one embodiment of the invention.

Shown in FIG. 4 is yet another embodiment formed utilizing the method of this invention. After having formed the structure of FIG. 1G wherein layer 8 is highly doped P-type silicon having a concentration of approximately $2.3 \times 10^{19}$ atoms per cc., and overlying epitaxially grown layer 10 is N-type moderately doped to approximately $1 \times 10^{16}$ atoms per cc. By forming P-type regions 19 within the surface of layer 10, either an MOS type field-effect transistor is formed, or a lateral bipolar device is formed, depending upon doping concentration and junction width between regions 19. For example, forming P-type regions 19 by diffusing boron to a surface concentration of approximately $2.3 \times 10^{19}$ atoms per cc. and separating the pockets 19 by a distance of 12 microns, then a field-effect type transistor is formed after electrical connections are formed to the source, drain and gate terminals.

Likewise, by forming regions 19 to a proper concentration having a proper distance therebetween, then a lateral transistor is formed. The mode of operation and design features of such transistors are well-known in the art, and accordingly modifications to the above stated typical dimensions and concentrations will be apparent to one skilled in the art.

Figure 5:
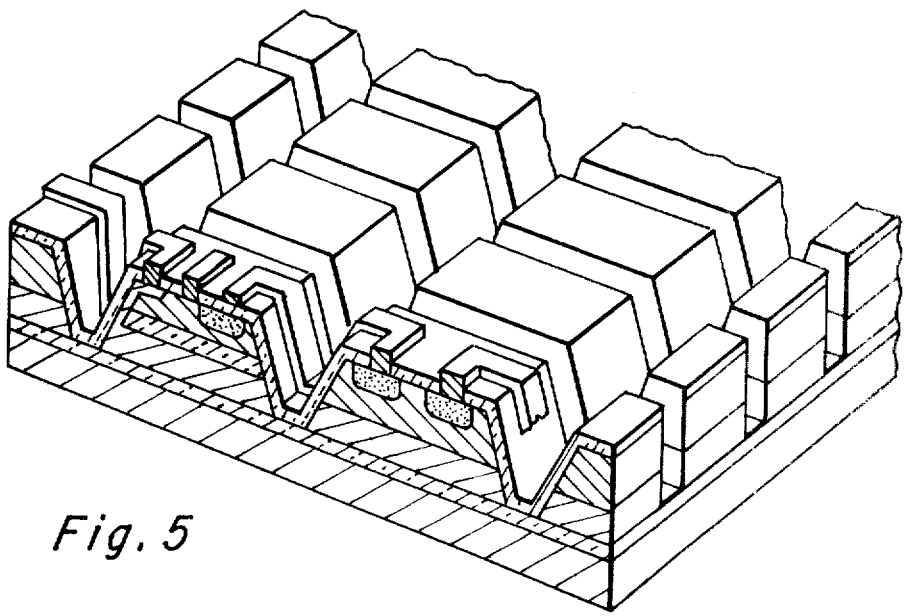
FIG. 5 depicts an integrated circuit embodiment of the invention.

Shown in FIG. 5 is yet another embodiment utilizing a method of this invention. A dielectrically isolated integrated circuit is depicted wherein the JFET of FIGS. 2A and 2B, the bipolar transistor of FIG. 3 and the transistor of FIG. 4 are shown within the air dielectrically isolated mesas 14. The method herein described in combination with well-known techniques in the art of integrated circuits readily provide the integrated circuit depicted in FIG. 5. Although not shown in FIG. 5, other well-known electronic circuit elements, such as resistors and diodes and capacitors are formed in other mesas 14 and interconnected with the transistors herein described.

It is understood that the partial interconnection of transistors in FIG. 5 is not to be construed as a limitation, but is exemplary of device interconnection via selected metallic formation over the low angled grooves in, for example, integrated circuits.

Although the preferred embodiments of this invention, herein described, have utilized a starting substrate material comprising (100) oriented monocrystalline silicon, it is understood that other crystal orientations could be utilized to provide other isolation groove structures.

Furthermore, other substrates besides silicon provide highly controllable crystallographic planes which may be preferentially etched along a predictable plane. Such other well-known materials are gallium arsenide and germanium.

Furthermore, the formation of regions in the epitaxially grown layers need not be diffused, but may be equally suitably ion implanted, which now is a well-known process in the art.

Although specific embodiments of this invention have been described herein in conjunction with specific semiconductor transistors, various modifications to the details of construction will be apparent to those skilled in the art for providing other electronic device embodiments without departing from the scope of the invention.

What is claimed is:

1. A method for producing dielectrically isolated electronic devices on a supporting electrically isolated substrate comprising the steps of:
    a. forming a plurality of orientation-dependent-etched grooves of precisely-known, different depths in a low-resistivity monocrystalline semiconductor body of one conductivity type,
    b. forming an insulation layer on said body and in said grooves,
    c. depositing a polycrystalline semiconductor support layer on said insulation layer,
    d. removing monocrystalline semiconductor material from the backside of said body, until a first layer having the desired thickness is achieved, as indicated by exposure of said insulation layer in the bottom of a selective groove,
    e. forming a second monocrystalline semiconductor layer of the other conductivity type overlying said first layer, to a desired thickness as indicated by said grooves,
    f. forming isolation moats circumscribing said first and second layers at a location spaced from said grooves, said moats extending to said substrate and providing a single crystalline mesa comprising said first and second layers, and
    g. forming semiconductor pockets of said other conductivity type selectively spaced within the surface of said second layer to provide active device regions.

2. The method of claim 1 wherein said substrate and said first and second layers are (100) oriented silicon.

3. The method of claim 1 and including the step of selectively forming a region of said one conductivity type in and through said second layer providing a means for electrically contacting said first layer.

4. The method of claim 3 and prior to the step of forming a first layer, the step of selectively removing any damaged regions from the upper surface of said substrate to provide a damage free surface on said substrate.

5. The method of claim 1 wherein said pockets are of said one conductivity type and form source and drain regions to provide a field-effect transistor.

6. The method of claim 1 wherein said pockets are of said one conductivity type and form collector and emitter regions to provide a lateral bipolar transistor.

7. The method of claim 1 wherein said pockets are of said one conductivity type to provide emitter regions to thereby provide a transistor.

8. The method for producing dielectrically isolated electronic devices according to claim 1 wherein said step of forming isolation moats provides air isolation.

* * * * *